United States Patent
Sanders et al.

(10) Patent No.: US 8,329,579 B2
(45) Date of Patent: Dec. 11, 2012

(54) THROUGH SUBSTRATE VIAS

(75) Inventors: Paul W. Sanders, Scottsdale, AZ (US); Michael F. Petras, Phoenix, AZ (US); Chandrasekaram Ramiah, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/188,084

(22) Filed: Jul. 21, 2011

(65) Prior Publication Data

US 2011/0272823 A1    Nov. 10, 2011

Related U.S. Application Data

(63) Continuation of application No. 12/425,159, filed on Apr. 16, 2009.

(51) Int. Cl.
*H01L 21/44* (2006.01)
*H01L 23/04* (2006.01)

(52) U.S. Cl. ............... 438/667; 257/696; 257/E21.597; 257/E23.011

(58) Field of Classification Search ............... 438/667, 438/620; 216/17; 257/E21.597, E21.586, 257/E23.008, 698
See application file for complete search history.

(56) References Cited

U.S. PATENT DOCUMENTS

| | | | |
|---|---|---|---|
| 6,468,889 | B1 | 10/2002 | Iacoponi et al. |
| 7,221,034 | B2 | 5/2007 | Ma et al. |
| 2002/0105087 | A1 | 8/2002 | Forbes et al. |
| 2003/0222354 | A1 | 12/2003 | Mastromatteo et al. |
| 2006/0094231 | A1 | 5/2006 | Lane et al. |
| 2007/0173135 | A1* | 7/2007 | Tanaka et al. .......... 439/751 |
| 2008/0003817 | A1 | 1/2008 | Morimoto |
| 2008/0073752 | A1 | 3/2008 | Asai et al. |
| 2008/0179755 | A1* | 7/2008 | Andry et al. .......... 257/774 |
| 2009/0045475 | A1 | 2/2009 | Wan et al. |
| 2009/0057899 | A1 | 3/2009 | Cheon et al. |
| 2009/0130846 | A1 | 5/2009 | Mistuhashi |
| 2010/0110607 | A1 | 5/2010 | Denatale et al. |
| 2011/0095428 | A1* | 4/2011 | Andry et al. .......... 257/751 |

FOREIGN PATENT DOCUMENTS

KR    1020090011952 A    2/2009

OTHER PUBLICATIONS

Korean Intellectual Property Office, International Searching Authority, "International Search Report and Written Opinion" mailed Dec. 15, 2010; International Appln. No. PCT/US2010/028297, filed Mar. 23, 2010.

* cited by examiner

*Primary Examiner* — Caridad Everhart
(74) *Attorney, Agent, or Firm* — Ingrassia Fisher & Lorenz, P.C.

(57) ABSTRACT

Through substrate vias (TSVs) are provided after substantially all high temperature operations needed to form a device region of a first thickness proximate the front surface of a substrate wafer by: (i) from the front surface, forming comparatively shallow vias of a first aspect ratio containing first conductors extending preferably through the first thickness but not through the initial wafer thickness, (ii) removing material from the rear surface to form a modified wafer of smaller final thickness with a new rear surface, and (iii) forming from the new rear surface, much deeper vias of second aspect ratios beneath the device region with second conductors therein contacting the first conductors, thereby providing front-to-back interconnections without substantially impacting wafer robustness during manufacturing and device region area. Both aspect ratios are desirably about ≦40, usefully ≦10 and preferably ≦5.

17 Claims, 12 Drawing Sheets

THROUGH SUBSTRATE VIAS

RELATED APPLICATION

This application is a continuation of co-pending U.S. patent application Ser. No. 12/425,159, filed on Apr. 16, 2009.

FIELD OF THE INVENTION

The present invention generally relates to semiconductor (SC) devices and integrated circuits (ICs) and their methods of manufacture, and more particularly, structures and methods for providing through-substrate-vias (TSVs) on semiconductor containing wafers, die and/or ICs.

BACKGROUND OF THE INVENTION

A need continues to grow for more complex semiconductor (SC) devices and circuits able to operate at higher and higher frequencies and handle increasing amounts of power and have lower unit cost. Many of these requirements create conflicting demands on semiconductor device and integrated circuit (IC) design and manufacturing technology. For example, and not intended to be limiting, most SC devices and ICs are fabricated in and/or on substrate wafers, usually but not always single crystal SC wafers, which are then cut up ("singulated") into the individual devices or ICs. The manufacturing cost can be reduced by using larger and larger wafers, since more individual devices and ICs can be produced at the same time on larger wafers. However, to avoid undue wafer breakage, the wafer thickness must generally be increased as the wafer diameter is increased.

If only one surface of the SC die or IC is available for fabricating devices and connections, the desired degree of complexity may not be achievable with present day structures and fabrication techniques. Further, as operating speed, power handling and wafer thickness increase, efficient heat removal from the resulting device or IC becomes more and more difficult. Thus, there is a strong desire to provide electrically and thermally conductive connections between the front and rear surfaces of the devices or ICs and to minimize the device and/or IC substrate thickness, without compromising mechanical robustness of the wafers during manufacture.

It is known to use conductor filled vias through SC wafers as a means of providing electrical and thermal connections between the front and rear surfaces of the wafer and resulting individual devices and IC die. These conductor filled vias are referred to as "through-substrate-vias" or "through-semiconductor-vias" and abbreviated as "TSV" (singular) or "TSVs" (plural). However, the desire to use larger diameter and therefore thicker wafers for cost efficient manufacturing and at the same time to provide highly conductive TSVs for electrically and/or thermally coupling the front and rear faces of the wafer and resulting die are in conflict. The thicker the wafers, the more difficult it is to etch and fill narrow TSVs with conductors. However, if the vias are made larger, then greater wafer and die surface area must be devoted to such vias. In the prior art, thicker wafers have generally required larger area TSVs consuming greater device and IC surface area, thereby lowering the device and IC packing density on the wafer and increasing the device and IC manufacturing cost. Trying to use large diameter thin wafers so as to maintain the device area packing density reduces the mechanical stability of the wafers. It is well known that thin wafers break more easily during device and IC processing, thereby reducing the manufacturing yield and increasing the cost of the finished devices and ICs. Thus, a need continues to exist for improved SC device and IC structures and fabrication techniques that can provide minimal area TSVs for front-side-to-back-side interconnections and thin device or IC substrates for efficient heat removal, without significantly compromising mechanical stability of the wafers during manufacturing.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1:
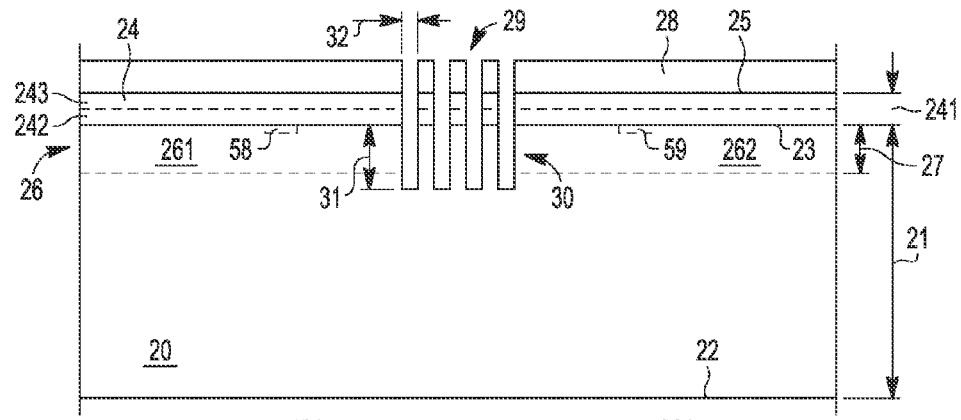
FIGS. 1-12 are simplified schematic cross-sectional views of a generalized SC device or IC wafer during various stages of manufacture, according to embodiments of the present invention.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions or layers in the figures may be exaggerated relative to other elements or regions or layers to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation or fabrication in sequences or arrangements other than those illustrated or otherwise described herein. Furthermore, the terms "comprise," "include," "have" and any variations thereof, are intended to cover non-exclusive inclusions, such that a process, method, article, or apparatus that comprises a list of elements or steps is not necessarily limited to those elements or steps, but may include other elements or steps not expressly listed or inherent to such process, method, article, or apparatus. The term "coupled," as used herein, is defined as directly or indirectly connected in an electrical or non-electrical manner.

As used herein, the term "semiconductor" is intended to include any semiconductor whether single crystal, poly-crystalline or amorphous and to include type IV semiconductors, non-type IV semiconductors, compound semiconductors as well as organic and inorganic semiconductors. Further, the terms "substrate" and "semiconductor substrate" and "wafer" are intended to include single crystal structures, polycrystalline and amorphous structures, thin film structures, layered structures as for example and not intended to be limiting semiconductor-on-insulator (SOI) structures, and combinations thereof. The term "semiconductor" is abbreviated as "SC." The terms "wafer" and "substrate", singular or plural, are intended to refer to supporting structures that are relatively thin compared to their lateral surface area and used in connection with batch fabrication of electronic devices. Non-limiting examples of such wafers and substrates include: semiconductor wafers, SOI wafers, and other types of supporting structures in or on which active and/or passive electronic elements and/or devices are fabricated or that are used in connection with the fabrication of such devices. As is common in the art of SC devices and integrated circuits (ICs), the term "metal" should be interpreted broadly so as to include any form of conductor and the term "oxide" should also be interpreted broadly so as to include any form of insulating dielectric. Non-limiting examples of such conductors are doped semiconductors, semi-metals, conductive alloys and mixtures, combinations thereof, and so forth. Analogously, such insulating dielectrics may be organic or inorganic insulators. For convenience of explanation and not intended to be limiting, semiconductor devices and methods of fabrication may be described herein for silicon semiconductors but persons of skill in the art will understand that other semiconductor materials can also be used.

FIGS. 1-12 are simplified schematic cross-sectional views of a generalized SC device or IC wafer during various stages 101-112 of manufacture, according to the present invention, showing structures 201-212 that result from each manufacturing stage 101-112. The convention is followed of identifying various common regions or dimensions that may change size, shape and/or location during the manufacturing process by the same reference numbers, wherein the initial regions, locations or values are identified by a plain reference number, as for example, regions, locations or thicknesses 20, 21, 22, etc., and the final or altered regions, locations or values are identified by the same reference number or letter with a prime (') added, as for example, regions, locations or thickness 20', 21', 22', etc., it being understood that the reference number or letter without the prime (') identifies the initial region, location or value and the same reference number with the prime identifies a subsequent or final region, location or value.

Referring now to manufacturing stage 101 of FIG. 1, initial substrate 20, of for example a semiconductor (SC), having rear or lower surface 22, upper or front surface 23 and initial thickness 21 therebetween is provided. Substrate 20 may be a homogeneous monolithic semiconductor substrate, a compound semiconductor substrate comprising layers or regions of different doping types or different semiconductor materials or combinations of semiconductors and insulators. Semiconductor-on-insulator (SOI) substrates are non-limiting examples of useful semiconductor-insulator combinations. Silicon is a non-limiting example of a useful SC material but other type III, IV, V or VI SC materials and combinations thereof, and organic semiconductors may also be used. Substrate 20 has therein various device regions 261, 262, etc., proximate upper surface 23, collectively referred to as device regions 26. Any types of electronic elements or devices may be provided in device regions 26, since the types of electronic elements or devices included in or on substrate 20 are not material to the illustrated embodiments, although they can benefit from the front-surface-to-back-surface connections (e.g., via TSVs) and the reduced thermal impedance provided by the thinned substrate wafers and die described herein. Device regions 26 extend to depth or thickness 27 from front surface 23 of substrate 20.

In most cases, it is desirable that the high temperature steps associated with forming the various electronic elements and/or devices in regions 26 have already been completed prior to manufacturing stage 101. Such high temperature processing steps are well known in the art. Non limiting examples of such high temperature steps are those used to form one or more of sources, drains, channels, emitters, bases, collectors, sinkers, dielectric isolation walls and layers, buried conductive and non-conductive layers, some passivation layers, highly doped contact regions, and other device elements. Illustrative doped contact regions 58, 59 are assumed to have been provided in device regions 261, 262 prior to manufacturing stage 101. Regions 58, 59 are intended to be representative of one or more contact regions present in device regions 26 and not be limiting. In most cases, the interconnections among the various device elements and devices and contact regions in regions 26 have not yet been formed, although some may be formed prior to manufacturing stage 101 and some may be formed later, as for example and not intended to be limiting, in connection with manufacturing stages 104-106. Either arrangement is useful.

Surface 23 of substrate or wafer 20 is generally covered with dielectric passivation layer 24 of thickness 241 as a consequence of the various processing steps utilized to form the various active and/or passive elements located in device regions 26. The term "wafer" is used to refer to substrates that are thin compared to their lateral size but is not intended to imply that a "wafer" must be a SC wafer nor is using a SC wafer precluded. However, for convenience of description it is assumed hereafter that substrate 20 is a SC wafer, but this is not intended to be limiting. Persons of skill in the art will understand that substrate 20 may have any of the forms and combinations of materials mentioned above as well as other forms and combinations of materials. It is desirable that dielectric layer 24 be a double layer, with portion 242 in contact with SC surface 23, generally chosen for its compatibility with surface 23, for example, so as to minimize undesirable surface states. Portion 243 is desirably chosen for its ability to act as a convenient etch and/or polishing stop during later stages of the manufacturing process. Silicon oxide is a convenient material for portion 242 and silicon nitride is a convenient material for portion 243, but in other embodiments, a single material (e.g., silicon oxide or other dielectric) may be provided for layer 24. Other passivating and etch or polishing stop materials may also be used. Initial thickness 21 of substrate or wafer 20 can be as large as is needed to insure mechanical robustness during wafer processing even though TSVs will be provided in later manufacturing stages, since the severe manufacturing problems associated with providing small area, high aspect ratio vias in thick wafers is avoided by the illustrated embodiments. This facilitates efficient manufacturing since unit cost generally decreases with increasing wafer diameter, which, in turn, generally means using thicker substrates or wafers.

The aspect ratio (AR) of a via is generally defined as the via depth (or length) divided by the via width (e.g., diameter), that is, via AR=d/w, where d is the via depth perpendicular to surface 23 and w is the via width (or diameter for a circular via) parallel to surface 23. Vias may have any cross-sectional shape viewed perpendicular to surface 23, for example, and not intended to be limiting, round, oval, polygonal, rectangular or annular (e.g., like a trench), and other shapes. Substrate initial thickness 21 generally depends upon the diameter of substrate 20, the larger the diameter the greater initial thickness 21 needed to provide favorable mechanical stability during manufacturing. By way of example and not intended to be limiting, for silicon wafers of ~200 mm diameter, initial thickness 21 can be in the range of about 600 to 700 micrometers and for silicon wafers of ~300 mm diameter, initial thickness 21 can be in the range of about 700 to 800 micrometers, but other diameters and thicker or thinner wafers can also be used. Embodiments of the present invention allows the via width w and aspect ratio (A/R=d/w) to be selected substantially independent of the initial wafer thickness, while at the same time preserving robust wafer mechanical strength during manufacturing, and making it possible to obtain thin finished devices and ICs when manufacturing is complete, so that heat extraction and electrical coupling to the devices therein and/or both are facilitated.

In manufacturing stage 101 of FIG. 1, mask layer 28 with openings 29 is provided on surface 25 of dielectric layer 24. Photoresist is an example of a suitable material for mask layer 28 although other soft and hard mask materials may also be used. Openings 29 are provided in mask layer 28 having, in this example, lateral widths 32. Cavities 30 are etched through dielectric layer 24 to depth 31 into substrate 20 beneath surface 23 using mask layer 28 with openings 29. Cavities 30 are also referred to as blind vias 30, and eventually as vias 30 when filled with a conductor and coupled to other conductive vias extending to the rear face of the substrate. Anisotropic etching is preferred for forming cavities 30. Where silicon is used for substrate 20, reactive ion etching (RIE) using $SF_6$ is preferred for forming cavities 30; however, other etchants or material removal techniques may also be used. Structure 201 results.

In the example of manufacturing stage 101 and resulting structure 201, four cavities (e.g., blind vias) 30 of depth 31 are formed in substrate 20, but this is merely by way of example and not intended to be limiting. Any number of cavities (and eventual vias) 30 can be formed at the same time, spaced at various locations within or near device regions 26. In general, the lateral width of eventual vias 30 will correspond to lateral width 32 of mask openings 29 and cavities 30 and for convenience of description reference number 32 is hereafter intended to also refer to the lateral width of eventual vias 30. It is desirable that width 32 be as small as possible consistent with depth 31, that is, that cavities and vias 30 have an aspect ratio that is readily achievable in manufacturing. It has been found that vias having width 32 (e.g., "w") usefully in the range of about 0.1 to 10 micrometers, more conveniently about 0.5 to 5 micrometers and preferably about 1 to 2 micrometers and depth 31 (e.g., "d") usefully in the range of about 1 to 30 micrometers, more conveniently about 5 to 20 micrometers and preferably about 10 to 15 micrometers can be readily achieved and filled with highly conductive materials, typically metals, doped semiconductors and/or alloys or mixtures of such materials. It is desirable that depth 31 of cavities 30 exceed depth 27 of device regions 26, especially where cavities 30 are closely spaced to transistors or other elements within device regions 26, but in other embodiments depth 31 may be shallower than device regions 26 depending upon the lateral location of cavities 30 relative to the transistors or other elements within device regions 26 and their desired operating potential relative to the conductors eventually provided in cavities 30. As used herein, the term "highly conductive" in reference to materials used for filling or lining various vias (e.g., vias 30) and the like is intended to include materials whose electrical resistivity is less than or equal to about 0.1 ohm-cm. Non-limiting examples of such highly conductive materials are tungsten, copper, tungsten silicide, doped semiconductors (e.g., polysilicon), and various mixtures and/or combinations of these and other highly conductive materials. The foregoing provides conductor filled cavities 30 (and eventual vias 30) with aspect ratios ($AR_{30}$) usefully in the range of about $1 \leq AR_{30} \leq 40$, more conveniently in the range of about $1 \leq AR_{30} \leq 10$ and preferably in the range of about $1 \leq AR_{30} \leq 5$, although larger or smaller aspect ratios can also be used. It will be noted that the width and aspect ratios of cavities (and eventual vias) 30 can be chosen substantially independent of initial thickness 21 of substrate 20. Thus, even though cavities and eventual vias 30 are narrow and occupy small surface area, wafers or substrates 20 can be relatively thick (e.g., many times cavity depth 31) and therefore robust so as to minimize wafer breakage during most of the processing steps required for forming the active and/or passive elements in device regions 26 and associated vias 30. Vias 30 are also referred to as "front-side vias" 30 since they are provided from front side 23 of wafer or substrate 20.

Figure 2:
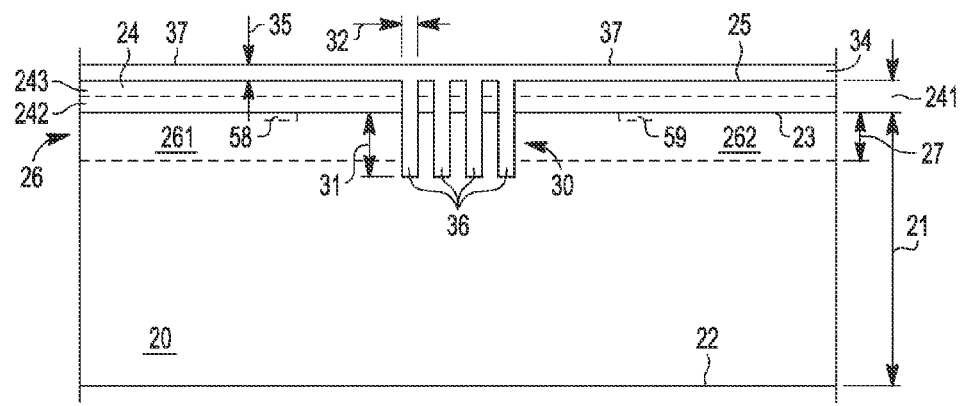

In manufacturing stage 102 of FIG. 2, layer 34 of thickness 35, comprising one or more highly conductive materials (e.g., such as those discussed above), is applied over surface 25 of dielectric layer 24 so as to fill cavities 30 with conductors 36. Thickness 35 is desirable at least equal to half of width 32 so as insure that conductors 36 fill cavities 30. In a preferred embodiment, tungsten deposited by chemical vapor deposition (CVD) is used, but other highly conductive materials may also be provided by CVD, plating, combinations thereof and/or other processes well known in the art. Structure 202 results. In some embodiments, a thin liner or layer of tungsten or titanium or other seed material is deposited (e.g., by sputtering or vacuum evaporation) into cavities 30 prior to CVD deposition. In still further embodiments, an insulating liner or layer (not shown in FIGS. 2-12) may be provided before forming conductors 36 in cavities 30 so as to electrically isolate conductors 36 in cavities 30 from substrate 20. Procedures for providing dielectric liners in cavities are described in connection with FIGS. 13-26, and substantially the same procedures can be used to provide dielectric liners in vias 30.

Figure 3:
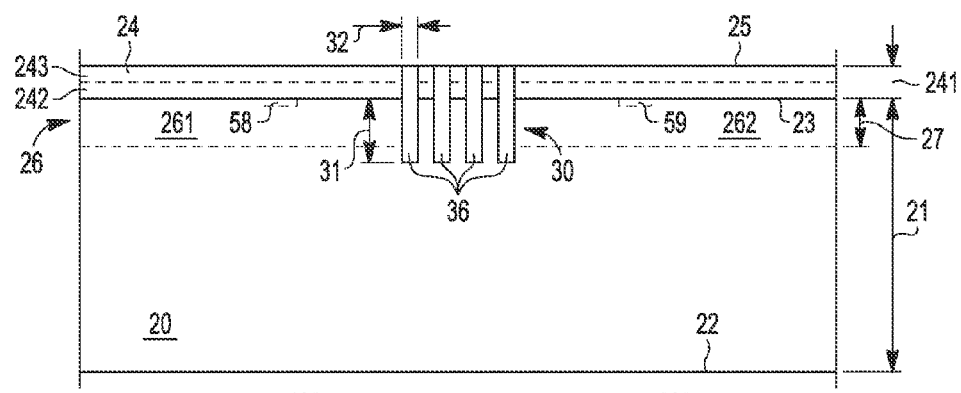

In manufacturing stage 103 of FIG. 3, structure 202 of FIG. 2 is subjected to an etching or polishing process to remove excess portions 37 of layer 34 lying above surface 25 while leaving conductors 36 in cavities 30. This is often referred to in the art as "planarization". Chemical-mechanical-polishing (CMP) is a preferred method for removing portions 37 of conductor layer 34, but other removal techniques may also be used. The exact nature of the CMP process will depend upon the choice of material for conductor layer 34. When tungsten is used for layer 34, CMP using hydrogen peroxide as the etchant is suitable for removing excess portions 37, but other etchants and etchant-slurry mixtures may also be used. CMP is well known in the art. Layer 243 of silicon nitride provides a convenient CMP etch stop. Structure 203 results.

Figure 4:
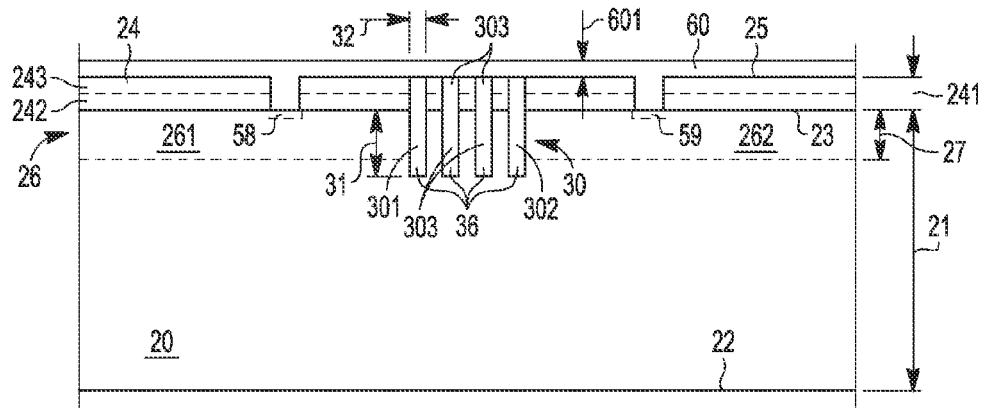
Figure 5:
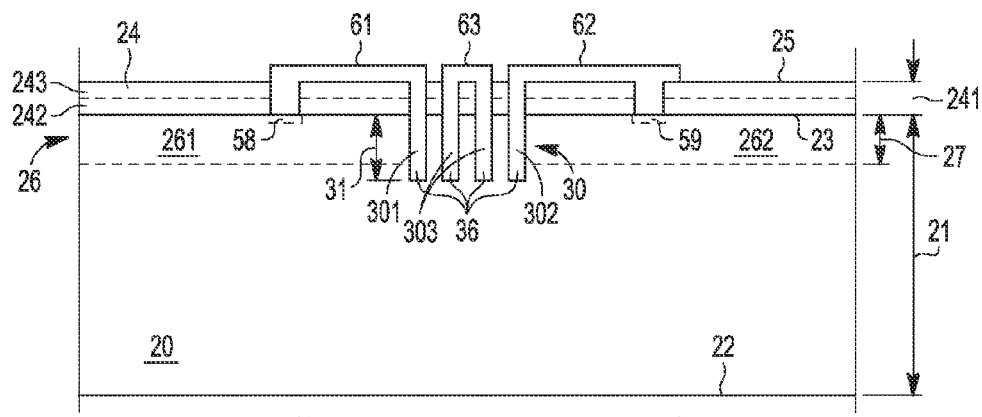
Figure 6:
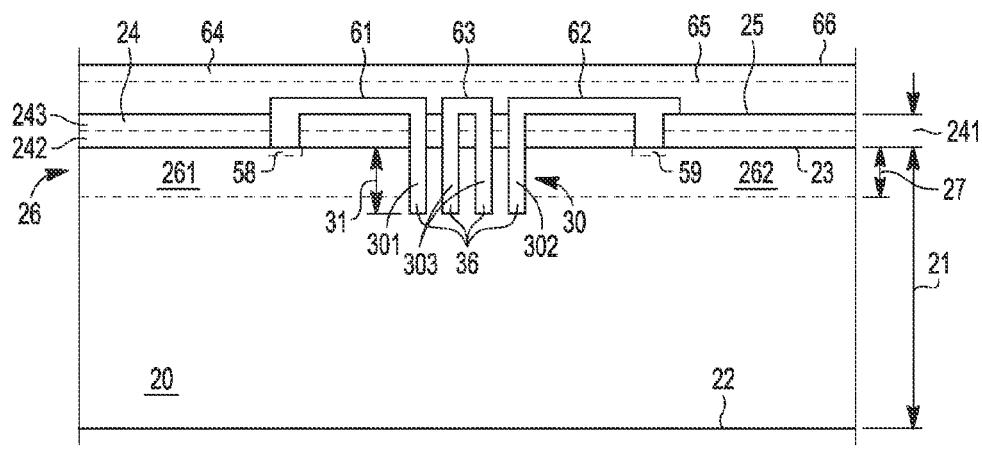

Referring now to manufacturing stage 104 of FIG. 4, following planarization in manufacturing stage 103, contact openings are desirably etched through dielectric layer 24 to illustrative contact regions 58, 59 in device regions 261, 262 and conductor (e.g., "first metal") layer 60 of thickness 601 is provided on surface 25, making electrical contact to conductors 36 in via cavities 30 and to illustrative contact regions 58, 59. Structure 204 results. In manufacturing stage 105 of FIG. 5, conventional interconnect masking and etching are used to delineate interconnections in layer 60 coupled to conductors 36 in one or more of vias 30. For example, interconnection 61 is provided from contact 58 to conductor 36 in left-most via 301, interconnection 62 is provided from contact 59 to conductor 36 in right-most via 302 and interconnection 63 is provided from other contact regions lying, for example, behind the plane of FIG. 5 to conductors 36 in central vias 303. Persons of skill in the art will understand that interconnections 61, 62, 63 are merely illustrative and not intended to be limiting and that interconnections may be provided from any of the elements and/or devices within regions 26 to one or the other or more of conductors 36 in the various vias 30 located in various parts of the individual ICs being fabricated on wafer substrate 20. For clarity, in FIG. 5 and hereafter, the interfaces where conductors 36 and interconnections 61, 62, 63 join have been omitted to emphasize the result that relatively high conductivity electrical continuity is provided from exemplary contact regions 58, 59 on front face 23 of substrate 20 to conductors 36 in vias 30 of substrate 20. Structure 205 results. In manufacturing stage 106 of FIG. 6, dielectric layer 64 with further conductors and/or interconnect layers 65 (indicated schematically by a dashed line) embedded therein may be provided using means well known in the art, but may be omitted in other embodiments. Conductors or interconnect layers 65 are often referred to as "metal-2", "metal-3", etc., depending upon the number of conductors and/or interconnect layers needed to implement the device or IC being formed on substrate 20. Some of these further conductors and/or interconnect layers may have portions (not shown) that are exposed and others may not, the exact configuration and number of interconnect layers depending upon the particular device and/or circuit function being created. Structure 206 results.

Figure 7:
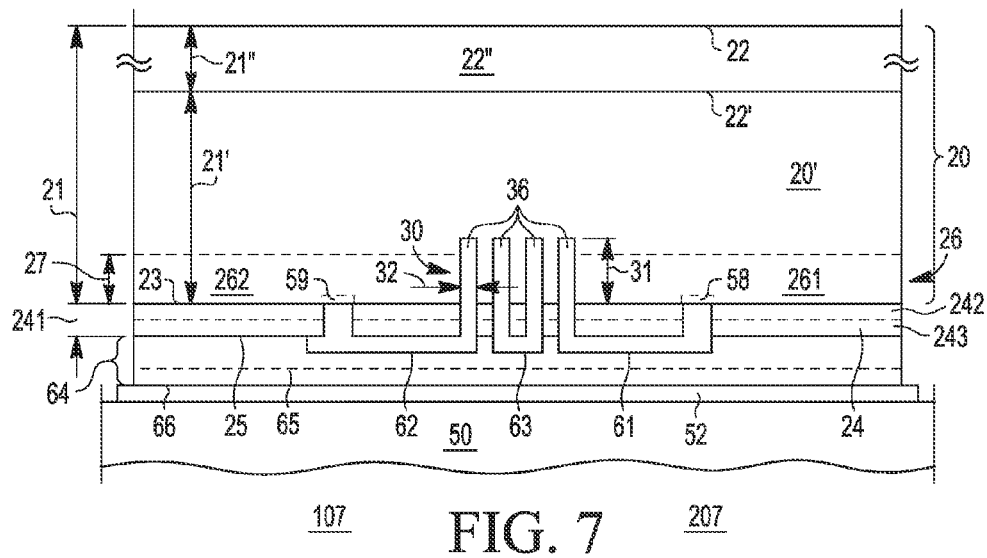

Referring now to manufacturing stage 107 of FIG. 7, substrate 20 is shown as being flipped over so that rear surface 22 of initial substrate 20 of initial thickness 21 is facing upward and exposed. It is desirable during manufacturing stage 107 (and 108-111) to mount substrate 20 by surface 25 of layer 24 or surface 66 of layer 64 on supporting carrier 50. This may be done by means of, for example and not intended to be limiting, double-sided sticky tape or adhesive 52, but other mounting techniques and materials well known in the art may also be used. The purpose of supporting carrier 50 is to provide mechanical support for wafer substrate 20, 20' during subsequent wafer thinning, etching and other generally low temperature operations. As substrate 20 is thinned it becomes more fragile and support carrier 50 is useful in minimizing breakage. However, in other embodiments when care is taking in handling wafers 20, 20', supporting carrier 50 may be omitted. In manufacturing stage 107, initial substrate 20 of initial thickness 21 is thinned by any desired process to remove portion 22" of thickness 21" proximate initial surface 22 of initial wafer 20, thereby establishing new surface 22' of thinned wafer or substrate 20' of desired final thickness 21'. By way of example and not intended to be limiting, it is desirable that final thickness 21' of substrate 20' be in the range of about 50 to 300 micrometers, more conveniently about 50 to 200 micrometers and preferably about 50 to 150 micrometers or less. Stated another way, it is desirable that about 50 to 95 percent of initial wafer thickness 21 be removed, more conveniently about 65 to 95 percent, and preferably about 85 to 95 percent of initial wafer thickness 21. Stated still another way, it is desirable that final wafer thickness 21' be about 5 to 50 percent of initial wafer thickness 21, more conveniently about 5 to 35 percent and preferably about 5 to 15 percent of initial wafer thickness 21. Thus, final thickness 21' of subsequent or final wafer or substrate 20' is a relatively small fraction of initial thickness 21 of initial wafer or substrate 20. Structure 207 results.

Figure 8:
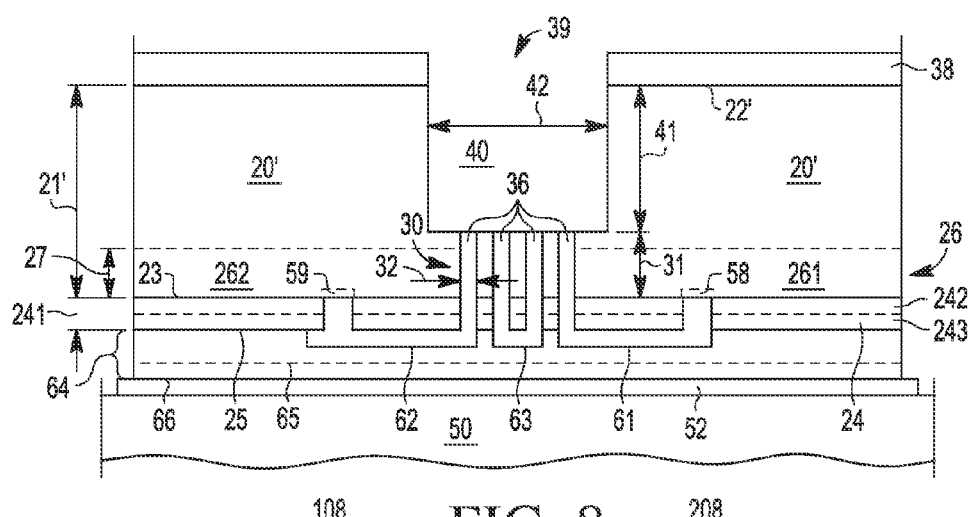

In manufacturing stage 108 of FIG. 8, mask layer 38 having opening 39 of width 42 is provided on newly exposed rear face or back-side surface 22' of thinned wafer or substrate 20'. Photoresist is a convenient material for mask layer 38 but other hard and/or soft mask layers may also be used. Such mask layers or materials are well known in the art. Back-side mask openings 39 are of lateral sizes and locations so as to overlie one or more front-side cavities or vias 30 filled with conductors 36. To facilitate this alignment, width 42 of opening 39 can be chosen so as to be substantially larger than widths 32 of front side vias 30, since it need not be located in a region of substrate 20' occupied by devices 26, but, preferably lies beyond region 26 where occupied area is not at a premium. In the preferred embodiment, width 42 is made large enough to desirably encompass or overlap one or more of front-side vias 30 and desirably several closely grouped front-side vias 30. Lateral dimensions or widths 42 of the various back-side cavities 40 are selected depending on the number and size of vias 30 intended to be contacted by particular back-side cavity 40 and of thickness 21' of substrate 20'. Dimension 42 is larger if back-side cavity 40 is intended to overlap several front-side vias 30 or if front-side vias 30 are larger. Similarly, dimension 42 is smaller if back-side cavity 40 is intended to overlap fewer front-side vias 30 or if front-side vias 30 are smaller. This is referred to as the cavity overlap or footprint. Cavities 40 (and eventual vias 40) desirably have a footprint large enough to laterally encompass one or more front-side cavities 30 and conductor(s) 36 therein. The aspect ratios of cavities 40 (e.g., $AR_{40}$) depend on their footprint and on thickness 21' of substrate 20', and are usefully in the range of about $0.1 \leq AR_{40} \leq 40$, conveniently in the range of about $0.1 \leq AR_{40} \leq 10$, and preferably in the range of $0.1 \leq AR_{40} \leq 5$. Cavities 40 with aspect ratios in these ranges can be readily fabricated in thinned wafers 20' described herein. By way of example and not intended to be limiting, backside vias 40 have width 42 usefully in the range of about 1 to 100 micrometers, more conveniently about 10 to 75 micrometers and preferably about 25 to 50 micrometers, but narrower or wider back-side vias can be formed depending upon the number of front-side vias intended to be within the back-side via footprint and the final wafer thickness 21', so as to still operate with readily manufactured aspect ratios such as those as noted above.

In manufacturing stage 108 of FIG. 8, cavities 40 of depth 41 and width 42 are etched in substrate 20' using mask layer 38 with opening(s) 39. Only one opening 39 and cavity 40 are shown in the drawings, but it should be understood than any number of such openings and cavities may be provided in different regions of substrate 20' and that any number of initial cavities 30 may be contacted by any of the various cavities 40 whose footprints encompass initial cavities 30. For example and not intending to be limiting, the footprint of a first of cavities 40 may intersect or overlap only one front-side via 30, while a second of cavities 40 has a footprint that intersects or overlaps a group of N front-side vias 30 (N=1, 2, 3 . . . etc.), and a third of cavities 40 has a footprint that intersects or overlaps a still different group of M front-side vias 30 (M=1, 2, 3 . . . etc.) and so forth, where N and M may have any integer values. Accordingly, persons of skill in the art will understand that the number, size and locations of back-side cavities 40 relative to front-side vias 30 depend upon the circuit designer's need to provide various front-side-to-back-side connections in different parts of the die or wafer being designed and manufactured.

The etch chemistry used to form cavities 40 will depend upon the material of substrate 20'. When substrate wafer 20' is of silicon, reactive ion etching (RIE) such as has been described in connection with formation of font-side cavities and vias 30 is preferred, but other cavity formation methods may also be used. An advantage of reactive ion etching (RIE)

for formation of cavities 40 is that the etching chamber gas may be analyzed during etching (preferably downstream from the etching chamber) to detect the presence of atoms or ions of conductor 36 from front-side vias 30. When such conductor atoms or ions are detected, this indicates that cavities 40 have penetrated to depth 41 sufficient to expose conductors 36 present in vias 30 located within the lateral footprints of various cavities 40, which is the desired objective of cavities 40. A limited duration over-etch after initial detection of atoms or ions of conductors 36 may be desirable, depending upon any non-uniformity in overall wafer thickness 21' after the wafer thinning operation of manufacturing stage 107, so as to provide assurance that cavities 40 in different parts of wafer substrate 20' have penetrated to all their corresponding target vias 30 substantially everywhere across wafer substrate 20'. The amount of over-etching that is needed will depend upon the etching chemistry and tools being used and may be easily determined by a limited series of simple timed experimental runs. Such tests are within the routine competence of those of ordinary skill in the art. It has been found that wafer thickness uniformity can be readily preserved to within 1-2 micrometers or less using conventional, present-day, processing technology, so that the over-etch generally does not need to penetrate into device regions 26 associated with cavities 30. Structure 208 results wherein conductors 36 in vias 30 are exposed in the bottom of cavities 40. It should be understood that some cavities 40 may expose conductor 36 of a single via 30 and other cavities 40 will expose conductors 36 of multiple vias 30, depending upon the number of vias 30 overlapped by the footprint of a particular via 40. Structure 208 of FIG. 8 illustrates the situation wherein a single back-side cavity 40 overlaps and connects with four front-side vias 30 each filled with conductor 36.

Figure 9:
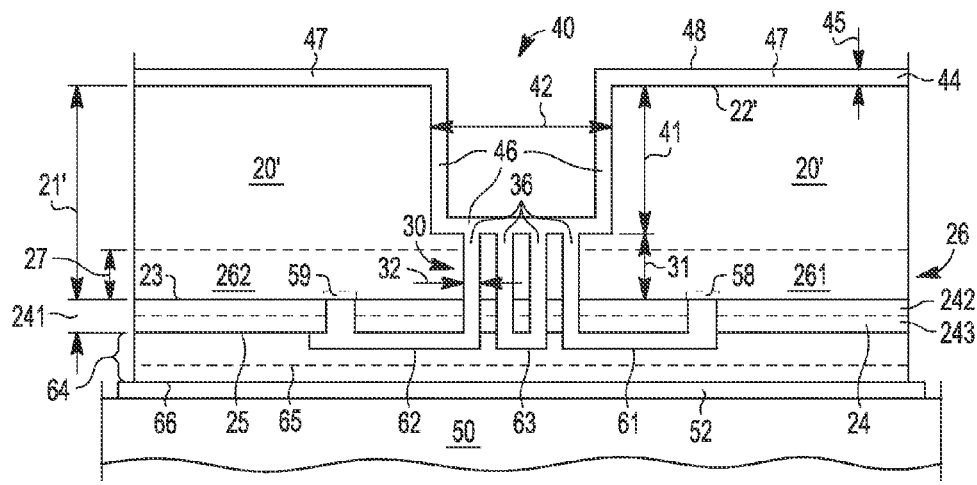

Referring now to manufacturing stage 109 of FIG. 9, mask 38 is removed and layer 44 of thickness 45, comprising one or more of the highly conductive materials such as those discussed above, is applied over surface 22' of substrate 20' so as to line cavities 40 with conductor 46. Thickness 45 should be sufficient to provide the desired electrical and/or thermal conduction path between conductors 36 in vias 30 to portions 47 of layer 44 on rear face 22' of substrate 20'. By way of example and not intended to be limiting, thickness 45 is usefully in the range of about 0.1 to 25 micrometers, more conveniently in the range of about 0.5 to 15 micrometers and preferably in the range of about 1 to 10 micrometers, but thicker and thinner layers may also be used depending upon the particular design objectives. In a preferred embodiment, copper deposited by electroplating is used for layer 44, but other conductive materials may also be provided by plating, chemical vapor deposition (CVD), combinations thereof and/or other processes well known in the art. In some embodiments, a thin adhesion promoting liner or layer of tungsten or titanium or other seed material is deposited into cavities 40 prior to forming conductors 46, using means well known in the art. In still further embodiments an insulating liner or layer (not shown in FIG. 9-12) may be provided prior to forming conductors 46 to as to substantially electrically isolate conductors 46 in cavities 40 from substrate 20' (e.g., see FIG. 13-24). Structure 209 results. Other than removal of support 50, structure 209 is ready for use. However, further manufacturing stages may be provided in other embodiments, as illustrated, for example and not intended to be limiting, in FIGS. 10-12.

Figure 10:
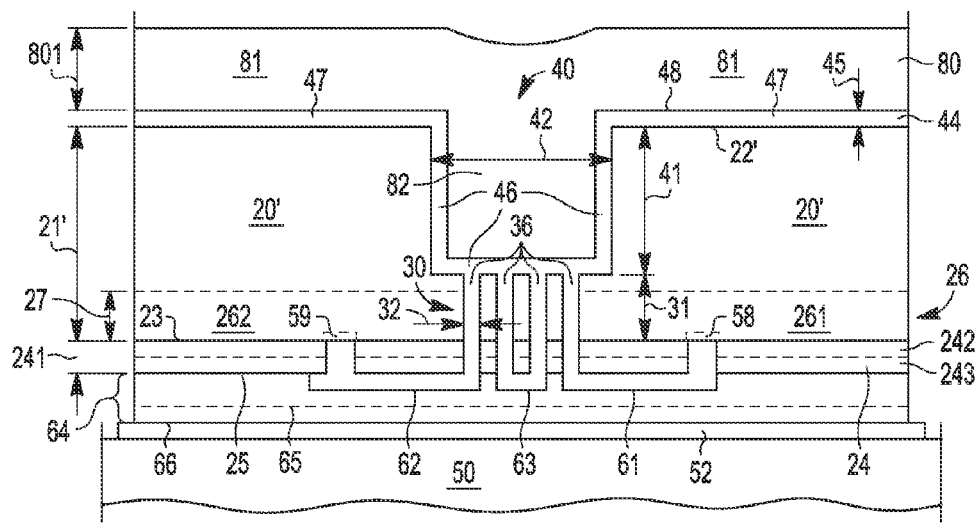
Figure 11:
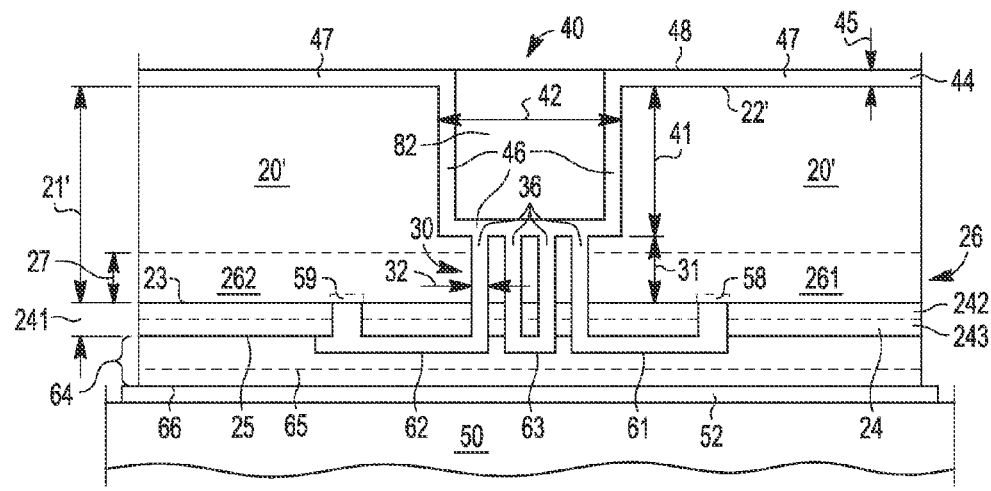

In manufacturing stage 110 of FIG. 10, material 80 of thickness 801 may be deposited on portions 47 of layer 44 on rear surface 22' of substrate 20 and in cavity 40 so as to fill cavity 40 with material 82, typically a dielectric. Polyimide, BCB and parylene are non-limiting examples of suitable dielectric materials for filling cavity 40, but other conductive or non-conductive materials may also be used. BCB is an abbreviation for bis-benzocyclobutene, which is, for example, available from Dow Chemical of Midland, Mich. Thickness 801 is chosen so as to insure that cavity 40 is substantially filled by material 82. Structure 210 results. In manufacturing stage 111 of FIG. 11, structure 110 of FIG. 10 is planarized. The planarization process will depend on the choice of material 80 and is within the competence of those of skill in the art. Structure 211 results in cavity 40 filled with dielectric 82 and the remainder of material 80 removed. In manufacturing stage 112 of FIG. 12, wafer substrate 20' is removed from support 50 of FIG. 11 using means well known in the art, which depend on the choice of adhesive 52. In a preferred embodiment, substrate wafer 20' is then inverted and attached, for example, by surface 48 to a film carrier (not shown) for singulation and further back-end operations, but other means for handling substrate 20' for such operations may also be used. "Singulation" is the cutting or sawing or breaking up of a wafer into individual transistor or integrated circuit die so that they can be assembled into various device packages or modules or mounted on various types of protective or integrating structures. These are generally referred to as "assembly" or "back-end" operations and are well known in the art. Dielectric 82 can add strength to substrate 20' to facilitate handling during subsequent singulation and die bonding and/or attachment operations, and can increase the electrical and/or thermal conductivity between front surface vias 30 and whatever heat sink or electrode (not shown) is later provided in contact with surface 48 of portions 47 of layer 44 and dielectric 82. In other embodiments, substrate 20' may be left whole, that is, not singulated. Either arrangement is useful.

Figure 12:
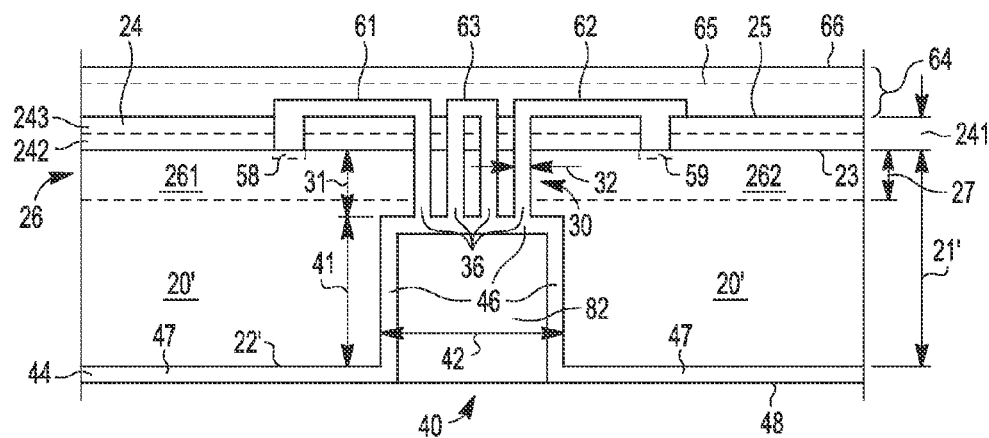
Figure 13:
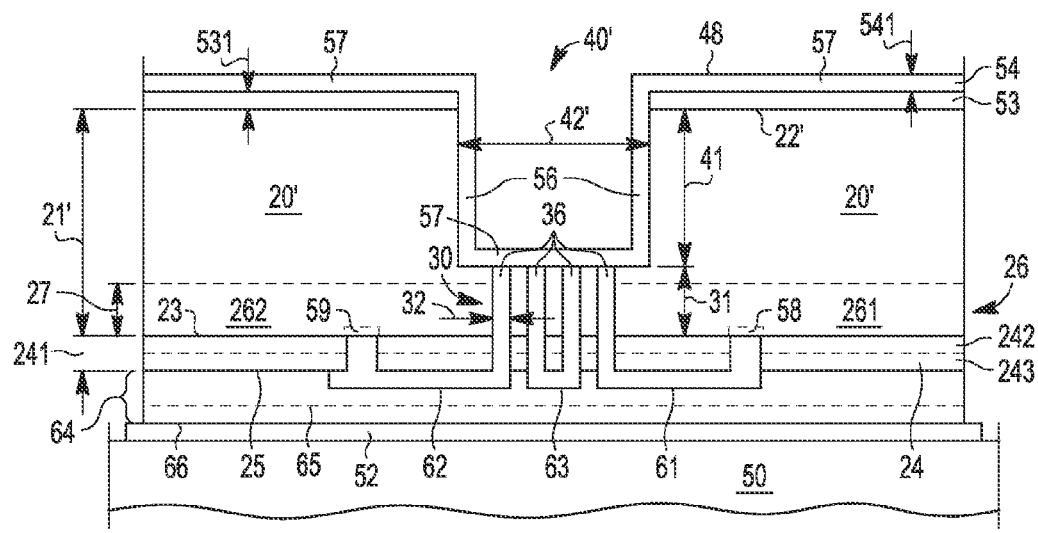
FIGS. 13-16 are simplified schematic cross-sectional views of further portions of the manufacturing process generally illustrated in FIGS. 1-12, wherein it is desired to line some vias with an insulating layer, according to further embodiments of the present invention.
Figure 14:
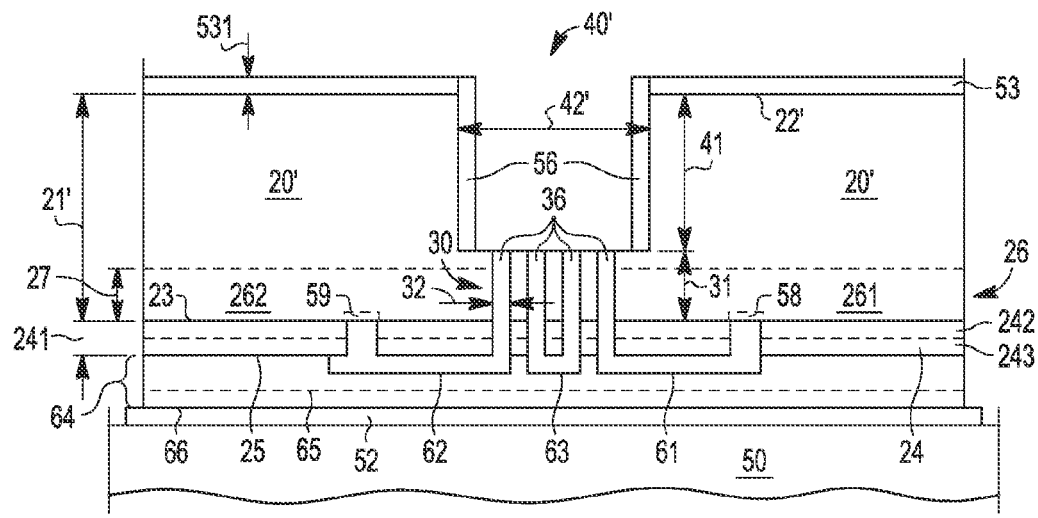

It will be noted in connection with FIGS. 9 and 12 that the objective of providing relatively high conductivity through substrate vias (TSVs) is accomplished. It will also be noted that initial, robust wafer thickness 21 is maintained through essentially all of the high temperature and device formation masking and doping operations needed to form the active and/or passive elements (e.g., sources, drains, channels, emitters, bases, collectors, buried layers, doped contact regions, dielectric isolation layers or walls or regions, passivation layers, and so forth) making up the desired device or IC, and that wafer thinning is postponed until later manufacturing stages wherein a support carrier that does not have to withstand high temperature operations can be utilized to minimize wafer breakage during this part of the manufacturing process. It will also be noted that by providing narrow TSVs 30 penetrating just device regions 26 where wafer and die area are at a premium rather than through the entire substrate wafer or die (which would require them to be much wider in order to still have workable aspect ratios), and placing deeper penetrating vias 40 underlying device regions 26 where substrate wafer or die area is not at a premium and where vias 40 can be much wider (e.g., $(width)_{40} \sim 25*(width)_{30}$ or more) while still having workable aspect ratios, that such workable aspect ratios can be maintained throughout the manufacturing process. Accordingly, the prior art problems of maintaining robust wafers during critical and especially high temperature manufacturing steps without being burdened by via aspect ratios that are extremely difficult to obtain, are avoided.

Figure 15:
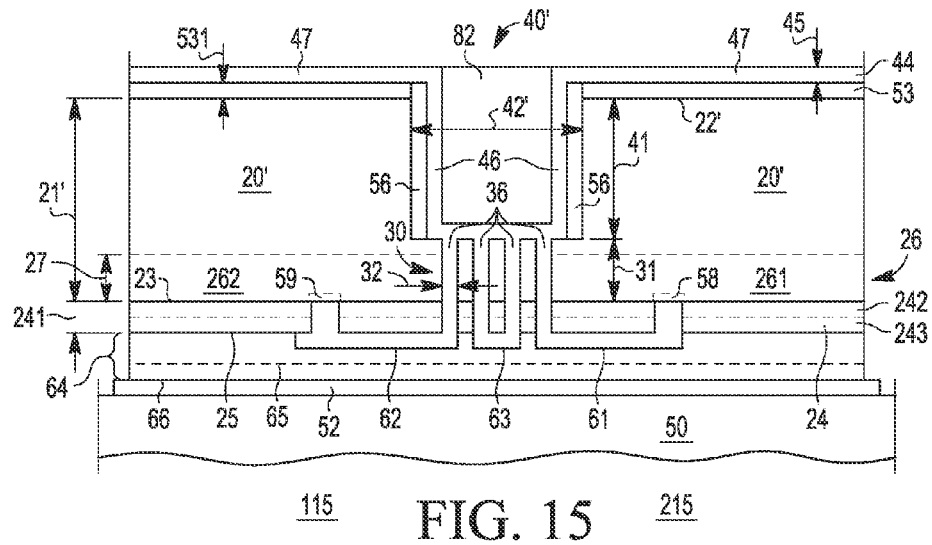
Figure 16:
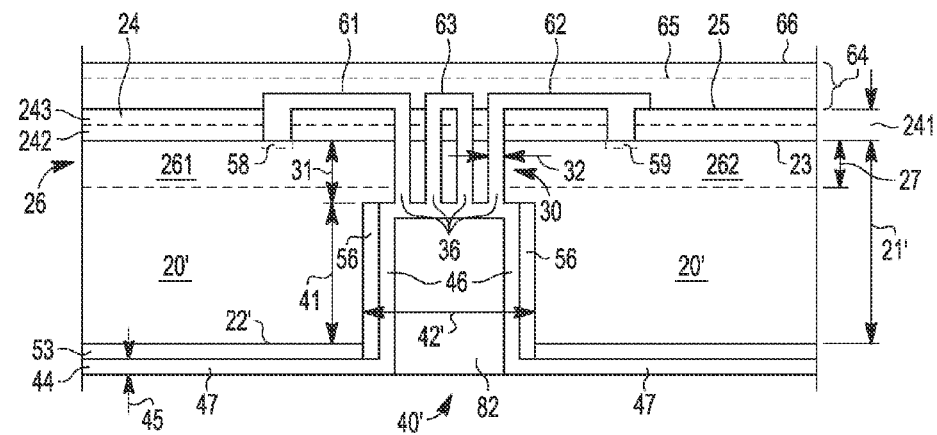

FIGS. 13-16 are simplified schematic cross-sectional views of manufacturing stages 113-116 added to the manufacturing process of FIGS. 1-8 and in some embodiments also 10-12, wherein it is desired to line some vias with an insulating layer, according to further embodiments of the present invention. Insulating layer 53 of thickness 531 is desirably provided on surface 22' of substrate 20' before or after providing mask 38 in manufacturing stage 108 of FIG. 8. Before is preferable. Thickness 531 is usefully in the range of about 10 to 1000 nanometers, conveniently in the range of about 50 to 500 nanometers and preferably in the range of about 100 to 300 nanometers, although thinner and thicker layers can also be used. Opening 39 of mask 38 of FIG. 8 is used to etch through layer 53 in opening 39. Manufacturing stage 113 of FIG. 13 follows from manufacturing stage 108 of FIG. 8. In manufacturing stage 113 of FIG. 13, mask 38 shown in FIG. 8 is removed after forming via cavity 40' of width 42' analogous to cavity 40 of width 42 previously described, and insulating dielectric layer 54 of thickness 541 is deposited on layer 53 and in via cavity 40' so that dielectric layer portions 56, 57 line the sides and bottom of via cavity 40'. When layer 54 is deposited by, for example, evaporation, sputtering or chemical vapor deposition (CVD) or the like, then thickness 541 is usefully in the range of about 1 to 1000 nanometers, conveniently in the range of about 5 to 500 nanometers and preferably in the range of about 100 to 300 nanometers, although thinner and thicker layers can also be used. If spin-on or spray-on dielectrics are used, then thickness 541 is usefully in the range of about 0.1 to 25 micrometers, more conveniently about 1 to 15 micrometers, and preferably about 1 to 10 micrometers. The latter category of materials includes photo-definable dielectrics like photoresist or BCB, and which are convenient because the dielectric can be removed from the bottom of cavities or vias 40' using photolithography. It is also desirable that layers 53 and 54 be chemically distinct so that layer 54 may be etched or otherwise removed without significantly attacking layer 53, but in other embodiments, they can be formed from the same material or layer 53 can be omitted. A combination of silicon oxide, silicon nitride, or silicon oxy-nitride is preferred for layers 53 and 54, but other dielectric materials can also be used for these layers. Structure 213 results. In manufacturing stage 214 of FIG. 14, anisotropic etching or other anisotropic dissolution or removal procedure is desirably used to remove portions 57 of layer 54 lying above dielectric 53 and in the bottom of vias 40', leaving dielectric portions 56 on the sidewalls of vias 40'. Structure 214 results. In manufacturing stage 115 of FIG. 15, conductor layer 44 of thickness 45 is deposited on layer 53 and remaining portions 56 of layer 54 so as to line cavities 40' and make contact with exposed ends of conductors 36 in the bottoms of front-side vias 30 and have portions 47 extending onto dielectric layer 53 on back-side surface 22' of substrate 20'. Structure 215 is analogous to structure 209 of FIG. 9 and structure 211 of FIG. 11, except that conductor regions 46, 47 are substantially insulated from substrate 20'. Also shown in manufacturing stage 115 of FIG. 15 is material 82 in cavity 40', analogous to material 82 in cavity 40 of FIG. 11, the discussion of which is incorporated herein by reference. Structure 215 results. Manufacturing stage 116 of FIG. 16 is analogous to manufacturing stage 112 of FIG. 12, the discussion of which is generally also applicable here. Structure 216 results, wherein conductors 36 in front-side vias 30 are electrically (and thermally) coupled to portions 47 of back-side conductor layer 44 via sidewall conductor regions 46 that are substantially electrically isolated from substrate 20, although some minimal contact between conductor 44 and substrate 20' may occur in the bottom of cavities 40' and via conductors 36 in front-side vias 30.

Figure 17:
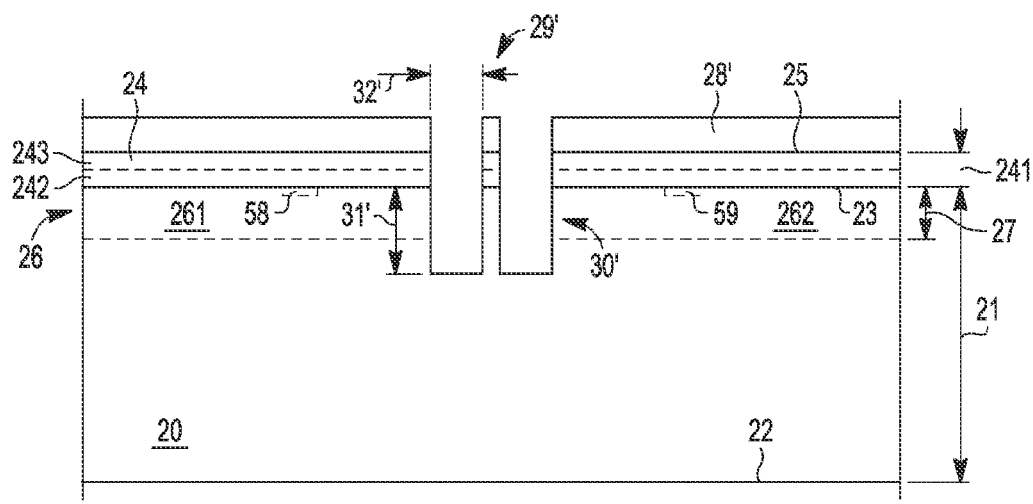
FIGS. 17-26 are simplified schematic cross-sectional views of still further portions of the manufacturing process generally analogous to those illustrated in FIGS. 1-16, but wherein it is desired to line all parts of some or all of the vias with an insulating layer, according to still further embodiments of the present invention.
Figure 18:
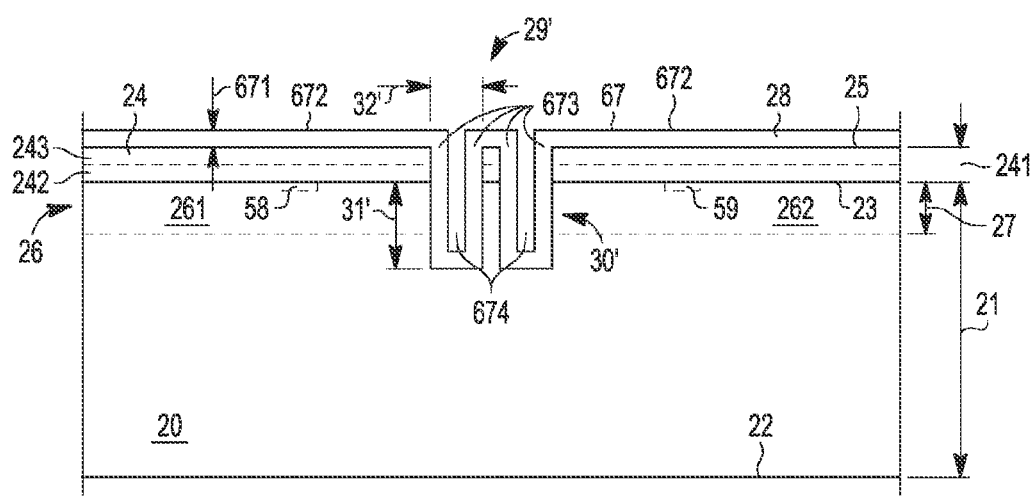
Figure 19:
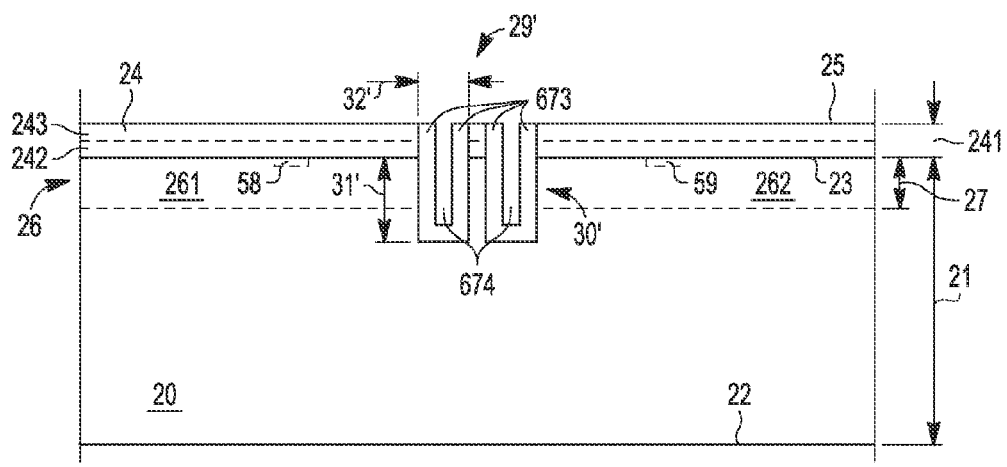
Figure 20:
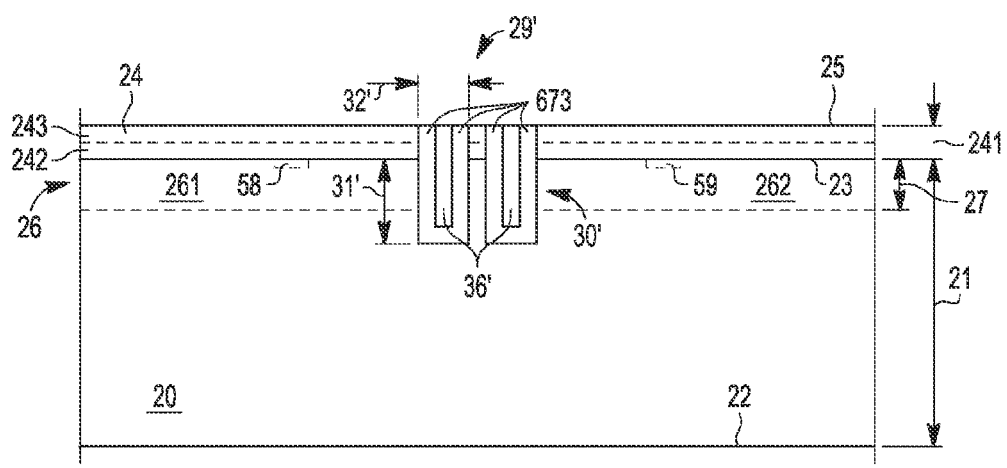

FIGS. 17-26 are simplified schematic cross-sectional views of manufacturing stages 117-126 generally analogous to those illustrated in FIGS. 1-16, but wherein it is desired to line all the vias with one or more insulating layers, according to still further embodiments of the present invention. Manufacturing stage 117 of FIG. 17 is generally analogous to manufacturing stage 101 of FIG. 1, wherein mask 28' analogous to mask 28 is applied to surface 25, having openings 29' of width 32' therein analogous to openings 29 of width 32. Cavities 30' of depth 31' analogous to cavities 30 of depth 31' are etched in substrate 20 using the procedures already described in connection with manufacturing stage 101 and the discussion of manufacturing stage 101 of FIG. 1 is incorporated herein by reference. Structure 217 results. For convenience of illustration, only two cavities 30' of width 32' are shown structure 217 of FIG. 17, but any number can be provided. In manufacturing stage 118 of FIG. 18, mask 28' is removed and dielectric layer 67 of thickness 671 is deposited or formed on surface 25 and in cavities 30'. Portions 672 of layer 67 overlie surface 25 and portions 673 line the sidewalls of cavities 30' leaving central portions 674 of cavities 30' empty. Structure 218 results. In manufacturing stage 119 of FIG. 19, anisotropic etching or other anisotropic dissolution or removal process is applied to structure 218 so as to remove portions 672 of layer 67 of structure 218 of structure 218, but in other embodiments, portions 672 may be left in place. Structure 219 results, assuming for convenience of description that portions 672 have been removed, thereby leaving dielectric sidewall portions 673 in cavities 30' with empty central portions 674 within cavities 30'. In manufacturing stage 120 of FIG. 20, empty central portions 674 of structure 219 are filled with highly conductive material 36' and planarized, analogous to conductors 36 of manufacturing stage 103 of FIG. 3 in cavities 30, the discussion of which is generally also applicable here. Structure 220 results. In manufacturing stage 121 of FIG. 21, contacts 58, 59 are coupled by conductors 61', 62' on surface 25 to conductors 36' in via cavities 30', as has been previously described in connection with conductors 61, 62 of FIG. 5, which discussion is also generally applicable here. Dielectric layer 64 with further interconnect layers (e.g., metal-2, metal-3, etc.) denoted schematically by dashed line 65, may also be provided, analogous to those described in connection with FIG. 6, which discussion is also generally applicable here. Structure 221 results. However, dielectric layer 64 and further interconnect layers 65 may be omitted in other embodiments.

Figure 21:
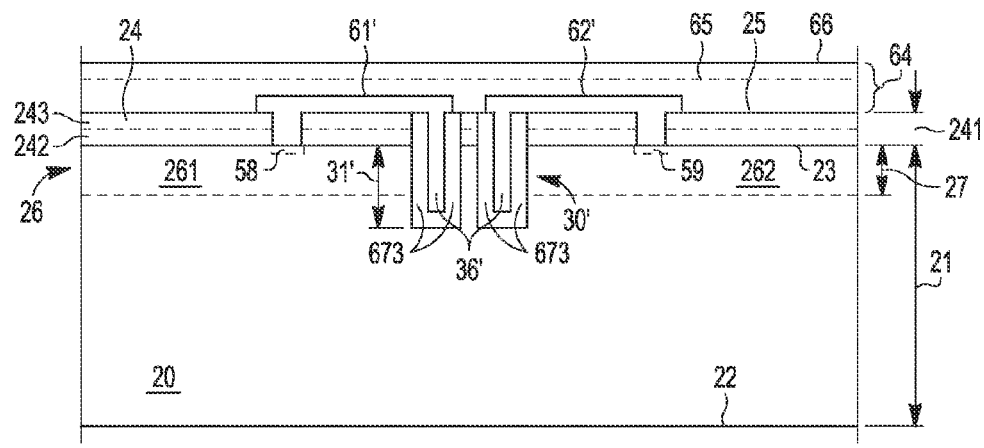
Figure 22:
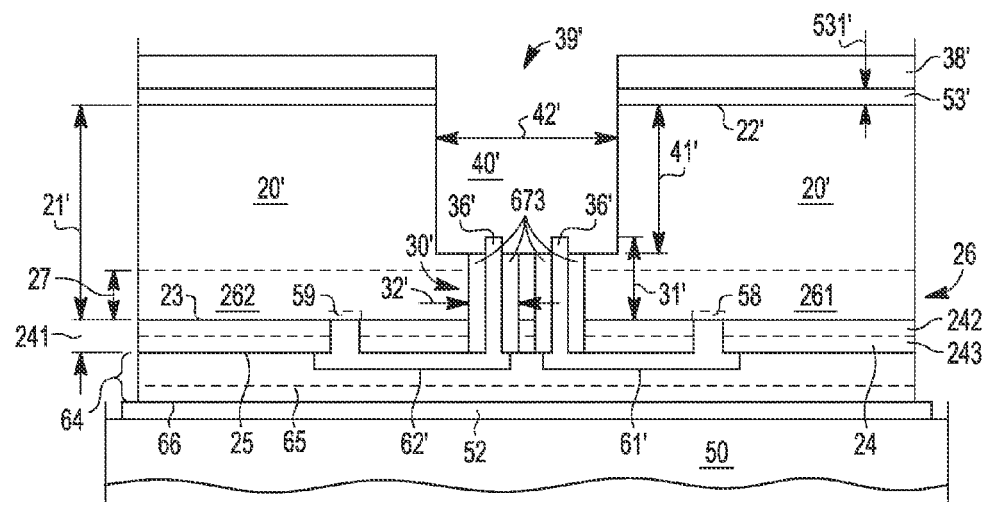
Figure 23:
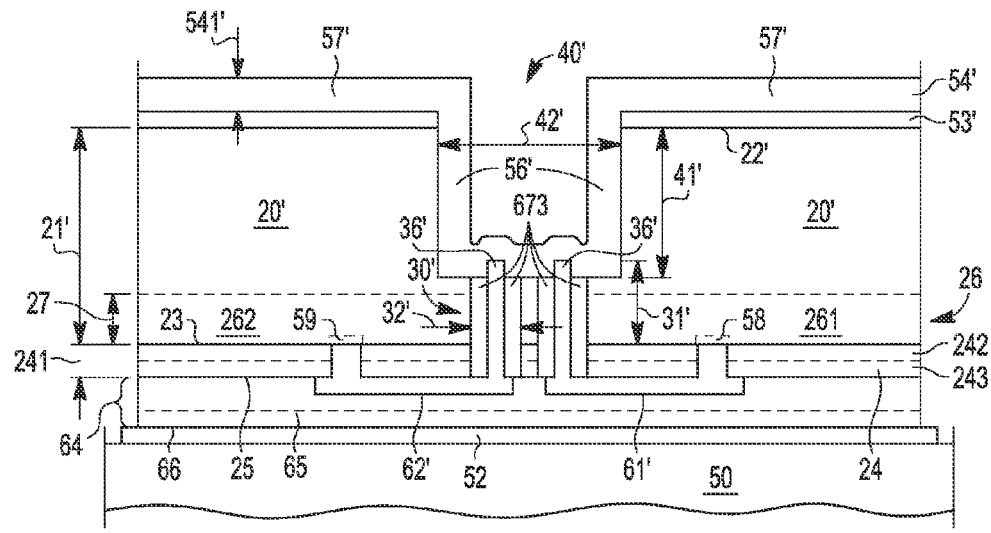
Figure 24:
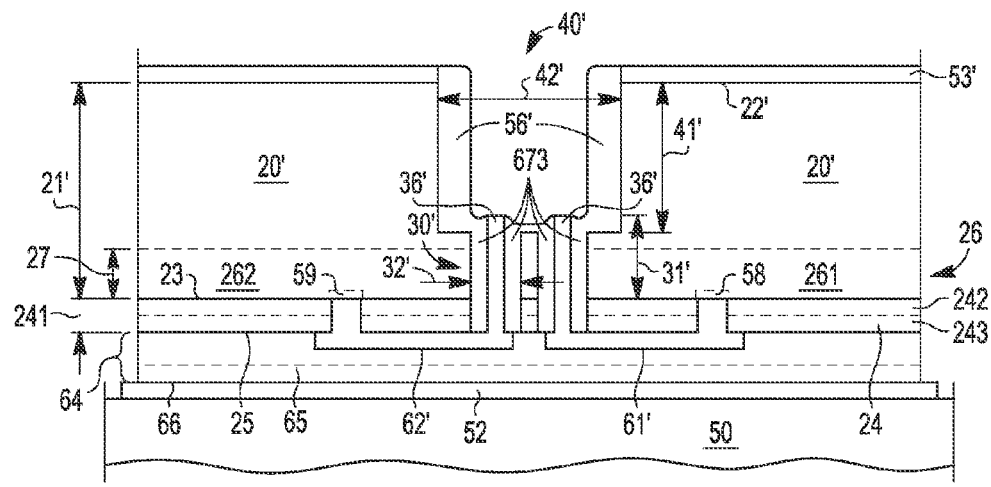
Figure 25:
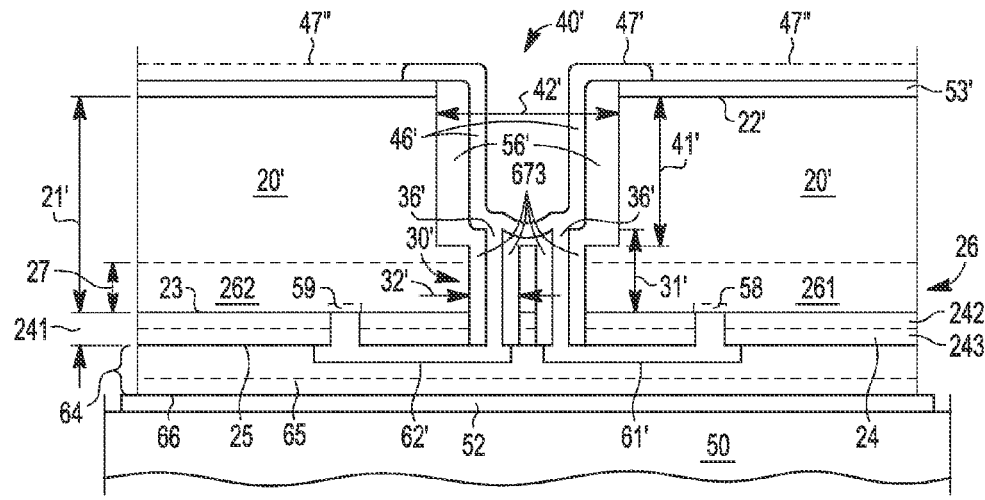
Figure 26:
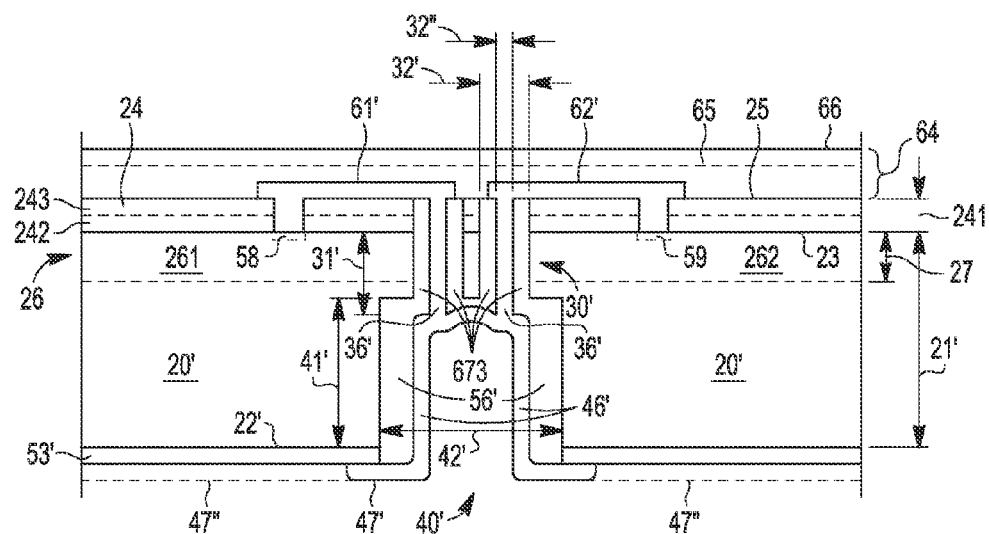

Referring now to manufacturing stage 122 of FIG. 22, structure 221 of FIG. 21 is flipped over and mounted on support structure 50 as has been previously described in connection with FIG. 7. The thinning operation described in connection with manufacturing stage 107 of FIG. 7 is performed so as to yield substrate 20' of thickness 21' with newly exposed rear surface 22'. Dielectric layer 53' of thickness 531' is desirably applied on rear face 22' of substrate 20', but may be omitted in other embodiments. Mask layer 38' analogous to mask layer 38 is applied and opening 39' provided in the location desired for back side cavity 40' of width 42' analogous to backside cavity 40 of width 42 of FIG. 8. Cavity 40' of width 42' is etched to depth 41' using opening 39' in mask 38'. The discussion of analogous manufacturing stages 107-108 of FIGS. 7-8 is also generally applicable here. It is desirable that depth 41' be such as to extend slightly beyond the exposed ends of conductors 36' in what was the bottom of front-side cavities 30'. Structure 222 results. In manufacturing stage 123 of FIG. 23, dielectric layer 54' of thickness 541' is deposited so as to have portions 56' lining cavity 40' and portions 57' above surface 22'. It is desirable that thickness 541' of layer 54 be such that sidewall portions 56' extend to dielectric sidewall portions 673 of front-side cavities 30'. Silicon oxide, silicon nitride or combinations thereof is an example of a suitable dielectric for layer 54' but other dielectric materials including organic dielectric materials may also be used. Structure 223 results. In manufacturing stage 124 of FIG. 24, anisotropic etching or other anisotropic removal process is used to remove portions 57' of layer 54' and expose the ends of conductors 36' of front-side vias 30' in cavities 40', while leaving dielectric sidewall portions 56' in place. The anisotropic etching or other removal process will depend upon the particular choice made by the user of material for layer 54'. Anisotropic etching or removal of various dielectric materials is well known in the art. Structure 224 results. In manufacturing stage 125 of FIG. 25, conductor 47' analogous to conductor 47 of FIG. 9 is provided in cavity 40' with portions 46' on dielectric liner 56' and in contact with the exposed ends of conductors 36' in front-side cavities 30'. Conductor 47' is insulated from substrate 20' by sidewall portions 56', a part of layer 53 surrounding cavity 41' and dielectric portions 673 in front-side cavities 30' communicating with sidewall dielectric portions 56' proximate the interior end of back-side cavity 40'. In yet further embodiments, conductor portions 47" may also be provided extending over portions 22' of substrate 20', but may be omitted in other embodiments, according to the needs of the designer. Structure 225 results. In manufacturing stage 126 of FIG. 26 analogous to manufacturing stage 112 of FIG. 12, substrate 20' is removed from carrier 50 and flipped over so as to be ready for singulation, die attach and/or whatever other back-end processes may be desired. Structure 226 results. The discussions of analogous manufacturing stages 101-112 of FIGS. 1-12 are also generally applicable here. In the particular case of structure 226 of FIG. 26, the filling of cavity 40' with material 82 (see FIGS. 10-12) is omitted, but this is merely to avoid cluttering the drawings and material 82 may be included or omitted according to the needs of the designer and the back-end manufacturing process.

Thus, another arrangement is provided whereby comparatively high electrical (and thermal) conductivity through substrate vias (TSVs) are provided. It will also be noted that initial robust wafer thickness 21 is maintained substantially through the masking and high temperature device formation operations needed to form the active and passive elements (e.g., sources, drains, channels, emitters, bases, collectors, buried layers, doped contact regions, dielectric isolation layers or walls or regions, passivation layers, and so forth) making up the desired device or IC in regions 26, and that wafer thinning is postponed until nearly the last manufacturing stages wherein a support carrier that does not have to withstand high temperature operations can be utilized to minimize wafer breakage during this part of the manufacturing process. It will also be noted that by providing narrow TSVs 30, 30' penetrating just device regions 26 where wafer and die area are at a premium rather than through the entire substrate wafer or die (which would require them to be much wider in order to still have workable aspect ratios), and placing deeper penetrating vias 40, 40' beneath device regions 26 where substrate wafer or die area is not at a premium and where vias 40, 40' can be much wider while still having workable aspect ratios, that workable aspect ratios can be maintained throughout the manufacturing process. Accordingly, the prior art problems of maintaining robust wafers during manufacturing without being burdened by via aspect ratios that are extremely difficult to obtain, are avoided.

It will be noted that front side vias 30, 30' can be narrow and shallow, generally, just deep enough to penetrate device region 26 and narrow enough to conserve valuable chip real estate, while back side vias 40, 40' penetrate through the bulk of finished wafer 20', and that both front-side and back-side vias have readily achievable aspect ratios. For example, both front-side and back-side vias can have aspect ratios usefully in the range of $0.1 \leq AR_{30\&40} \leq 40$, more conveniently in the range of about $0.1 \leq AR_{30\&40} \leq 10$, and preferably in the range of about $0.1 \leq AR_{30\&40} \leq 5$, which can be readily fabricated even in the thickest portions of the substrate. Stated another way, front side vias 30, 30' need only be about 0.1 to 10 micrometers wide and 1 to 30 micrometers deep thereby conserving precious front-side circuit area, while back-side vias 40, 40' can be in the range of about 5 to 5000 micrometers wide and penetrate through 50 to 300 or more micrometers of substrate with generally similar aspect ratios. Stated another way, depth 31, 31' of front-side vias 30, 30' can be usefully less than or equal about 50 percent of thinned substrate thickness 21', more conveniently, less than or equal about 25 percent and preferably about 10 percent of thinned substrate thickness 21' or less, while back-side vias can be usefully in the range of about 50 to 99 percent of thinned substrate thickness 21', more conveniently in the range of about 75 to 99 percent and preferably in the range of about 90 to 99 percent of thinned substrate thickness 21'. Being able to make the back-side vias substantially wider without consuming precious front-side device real estate where the active devices are located, allows their aspect ratios to be held within convenient manufacturing tolerances even with substrates that are robust enough to mitigate manufacturing loss. Thus, front-side to back-side electrical and/or thermal continuity can be achieved at minimal cost in circuit or chip area and still be readily manufacturable.

According to a first embodiment, there is provided a method for forming through substrate via (TSV) connections, comprising, providing a substrate wafer (20) of first thickness (21), having a front surface (23) and an opposed rear surface (22), and in which front surface (23) semiconductor devices have already been formed in a device region (26) of thickness (27) proximate the front surface (23), forming first vias (30, 30') containing a first conductor (36, 36') and extending from the front surface (23) into or through the device regions (26) but not through the substrate wafer (20), removing material from the rear surface (22) of the substrate wafer (20) to form a thinned substrate wafer (20') of a reduced thickness (21') and having a newly exposed rear surface (22'), forming second vias (40, 40') extending inward from the newly exposed rear surface (22') to intercept one or more first conductors (36, 36'), and depositing a conductive lining (46, 46') in the second vias making electrical contact with the one or more first conductors (36, 36'), thereby providing electrical or thermal continuity or both from the front surface (23) to the newly exposed rear surface (22'). According to a further embodiment, the method further comprises providing electrical interconnections between one or more contacts (58, 59) in the device region (26) and one or more conductors (36, 36') in the first vias (30, 30') thereby electrically coupling at least one of the contacts (58, 59) to the conductive lining (46, 46') of one of the second vias (40, 40'). In a still further embodiment, the first vias (30, 30') have a first width (32, 32') and a first depth (31, 31') and the second vias (40, 40') have a second width (42, 42') and a second depth (41, 41'), such that the second depth (41, 41') is larger than the first depth (31, 31') and the second width (42, 42') is larger than the first width (32, 32'). In a yet further embodiment, the final thickness (21') is about 5 to 50 percent of the initial thickness (21). In a still yet further embodiment, the first depth is about 1 to 30 micrometers. In a yet still further embodiment, the first width is about 0.1 to 10 micrometers. In another embodiment, the first vias and the second vias both have aspect ratios in the range of about 1 to 40. In a still another embodiment, the first depth (31, 31') is larger than the thickness (27) of the device region (26). In a yet another embodiment, the first depth (31, 31') is less than or equal about 50 percent of the final thickness (21')

According to a second embodiment, there is provided a method for providing through substrate vias (TSVs), comprising, providing a substrate (20) having an initial thickness (21) between an initial back side (22) and a front side (23) thereof, forming an electronic device region (26) in or on the substrate proximate the front-side (23) and of a first depth (27), etching one or more front-side cavities (30, 30') of a first width (32, 32') and a second depth (31, 31'), filling the front-side cavities (30, 30') with a first conductor (36, 36'), removing material from the initial back side (22) of the substrate (20) to form a modified substrate (20') having a modified thickness (21') less than the initial thickness (21) and expose a new back side (22') thereof, etching one or more back-side cavities (40, 40') of a second width (42, 42') and a third depth (41, 41') thereby exposing one or more of the conductors (36, 36') in one or more of the front-side cavities (30, 30'), and depositing a second conductor in the one or more back-side cavities (40, 40') electrically coupled to one or more of the first conductors (36, 36') of the front-side cavities (30, 30'). According to a further embodiment, the first depth is less than the second depth. According to a still further embodiment, the second depth is less than the third depth. According to a yet further embodiment, the final thickness (21') is in the range of about 5 to 50 percent of the initial thickness (21). According to a still yet further embodiment, the final thickness (21') is in the range of about 5 to 35 percent of the initial thickness (21). According to a yet still further embodiment, the front-side cavities (30) have an aspect ratio ($AR_{30}$) in the range of about $1 \leq AR_{30} \leq 40$. According to another embodiment, the front-side cavities (30) have an aspect ratio ($AR_{30}$) in the range of about $1 \leq AR_{30} \leq 10$. According to a still another embodiment, the method comprises, providing a dielectric liner (673, 56') in one or more of the first (30, 30') or second (40, 40') vias to substantially insulate a conductor (36, 36'; 46, 46') therein from the modified substrate (21').

According to a third embodiment, there is provided an electronic device, comprising, a substrate having a front surface (23) and rear surface (22'), with a device region (26) of a first thickness (27) proximate the front surface (23), at least one first via cavity (30, 30') with a first conductor (36) therein, extending to a first depth (31, 31') from the front surface (23), and at least one second via cavity (40, 40') with a second conductor therein, extending to a second depth (41, 41) from the rear surface (22') greater than the first depth (31, 31') and with a foot-print overlapping the at least one first via cavity (30, 30'), wherein the first (36, 36') and second (46, 46') conductors are electrically coupled. According to a further embodiment, the first depth exceeds the first thickness. According to a still further embodiment, the first (30') and second (40') via cavities, have dielectric liners (673, 56').

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for forming through substrate via (TSV) connections, comprising:
    providing a substrate wafer of first thickness, having a front surface and an opposed rear surface, and in which front surface semiconductor devices have already been formed in a device region of a first thickness proximate the front surface;
    forming first vias containing first conductors and extending from the front surface into or through the device regions but not through the substrate wafer;
    removing material from the rear surface of the substrate wafer to form a thinned substrate wafer of a reduced thickness and having a newly exposed rear surface;
    forming a second via extending inward from the newly exposed rear surface to intercept multiple ones of the first conductors while leaving intact the portion of the device region in which the first vias are formed located between the front surface of the substrate wafer and the bottom of the second via;
    depositing a conductive lining in the second via making electrical contact with the first conductors, wherein a cavity remains in the second via after depositing the conductive lining, thereby providing electrical or thermal continuity or both from the front surface to the newly exposed rear surface; and
    filling the cavity with a dielectric material.

2. The method of claim 1, further comprising providing electrical interconnections between one or more contacts in the device region and one or more of the first conductors in the first vias thereby electrically coupling at least one of the contacts to the conductive lining of the second via.

3. The method of claim 1, wherein the first vias have a first width and a first depth and the second via has a second width and a second depth, such that the second depth is larger than the first depth and the second width is larger than the first width.

4. The method of claim 1, wherein the first vias and the second via both have aspect ratios in the range of about 1 to 40.

5. The method of claim 1, wherein the first depth is larger than the thickness of the device region.

6. The method of claim 1, wherein the first depth is less than or equal about 50 percent of the reduced thickness.

7. The method of claim 1, wherein the reduced thickness is about 5 to 50 percent of the first thickness.

8. The method of claim 7, wherein the first depth is about 1 to 30 micrometers.

9. The method of claim 8, wherein the first width is about 0.1 to 10 micrometers.

10. An electronic device, comprising:
    a substrate having a front surface and rear surface, with a device region of a first thickness proximate the front surface;
    multiple first via cavities with first conductors therein, extending to a first depth from the front surface and into the device region; and
    a second via cavity with a second conductor therein, extending to intersect the multiple first via cavities at a second depth from the rear surface, wherein the second depth is greater than the first depth and has a foot-print overlapping the multiple first via cavities, wherein the first and second conductors are electrically coupled to form at least one electrically-conductive path extending across the device region, the second conductor partially fills the second via cavity, and a dielectric material fills a remainder of the second via cavity.

11. The device of claim 10, wherein the first depth exceeds the first thickness.

12. The device of claim 10, wherein the first via cavities and the second via cavity have dielectric liners.

13. A method for forming through substrate via (TSV) connections, comprising:
  providing a substrate wafer having a front surface and an opposed rear surface, and in which front surface semiconductor devices have already been formed in a device region proximate the front surface;
  forming first vias containing first conductors and extending from the front surface into or through the device regions but not through the substrate wafer;
  forming a second via extending inward from the rear surface to intercept multiple ones of the first conductors while leaving intact the portion of the device region in which the first vias are formed located between the front surface of the substrate wafer and the bottom of the second via; and
  depositing a second conductor in the second via making electrical contact with the first conductors, thereby providing electrical or thermal continuity or both from the front surface to the rear surface.

14. The method of claim 13, wherein a cavity remains in the second via after depositing the second conductor, and wherein the method further comprises:
  filling the cavity with a dielectric material.

15. The method of claim 13, wherein forming the first vias comprises:
  forming a dielectric liner on sidewalls of the first vias; and
  filling the first vias with the first conductors.

16. The method of claim 13, further comprising: forming a dielectric liner on sidewalls of the second via prior to depositing the second conductor in the second via.

17. The method of claim 13, further comprising the step, performed after forming the first vias and before forming the second via, of:
  removing material from the rear surface of the substrate wafer to thin the substrate wafer.

* * * * *